(12) United States Patent
Falk et al.

(10) Patent No.: US 11,201,057 B2
(45) Date of Patent: Dec. 14, 2021

(54) TECHNIQUES AND APPARATUS FOR ANISOTROPIC STRESS COMPENSATION IN SUBSTRATES USING ION IMPLANTATION

(71) Applicant: APPLIED Materials, Inc., Santa Clara, CA (US)

(72) Inventors: Scott Falk, Essex, MA (US); Jun-Feng Lu, Shanghai (CN); Qintao Zhang, Mt. Kisco, NY (US)

(73) Assignee: APPLIED Materials, Inc., Santa Clara, CA (US)

(*) Notice: Subject to any disclaimer, the term of this patent is extended or adjusted under 35 U.S.C. 154(b) by 0 days.

(21) Appl. No.: 16/512,734

(22) Filed: Jul. 16, 2019

(65) Prior Publication Data

US 2020/0118822 A1 Apr. 16, 2020

(30) Foreign Application Priority Data

Oct. 10, 2018 (WO) ................ PCT/CN2018/109604

(51) Int. Cl.
*H01L 21/265* (2006.01)
*H01L 21/302* (2006.01)
*H01L 21/02* (2006.01)
*H01L 21/322* (2006.01)
(Continued)

(52) U.S. Cl.
CPC ........ *H01L 21/265* (2013.01); *H01L 21/0217* (2013.01); *H01L 21/02351* (2013.01); *H01L 21/302* (2013.01); *H01L 21/31155* (2013.01); *H01L 21/322* (2013.01); *H01L 23/562* (2013.01)

(58) Field of Classification Search
CPC ................. H01L 21/302; H01L 21/562; H01L 21/31155; H01L 21/02351; H01L 21/265; H01L 21/322; H01L 23/562; H01L 2924/3511
See application file for complete search history.

(56) References Cited

U.S. PATENT DOCUMENTS

| 9,305,784 B2 * | 4/2016 | Ninomiya ........... H01J 37/3172 |
| 9,412,561 B2 * | 8/2016 | Kurose ............... H01J 37/3171 |
| 2004/0124452 A1 | 7/2004 | Wellhausen et al. |

(Continued)

FOREIGN PATENT DOCUMENTS

| CN | 105702564 | * | 6/2016 |
| CN | 105702564 A | | 6/2016 |

OTHER PUBLICATIONS

International Search Report and Written Opinion dated Jul. 18, 2019 for PCT/CN2018/109604 filed Oct. 18, 2019.

(Continued)

*Primary Examiner* — Michael M Trinh
(74) *Attorney, Agent, or Firm* — Kacvinsky Daisak Bluni PLLC

(57) ABSTRACT

A method may include providing a substrate, where the substrate includes a first main surface and a second main surface, opposite the first main surface. The second main surface may include a stress compensation layer. The method may include directing ions to the stress compensation layer in an ion implant procedure. The ion implant procedure may include exposing a first region of the stress compensation layer to a first implant process, wherein a second region of the stress compensation layer is not exposed to the first implant process.

14 Claims, 6 Drawing Sheets

(51) Int. Cl.
*H01L 21/3115* (2006.01)
*H01L 23/00* (2006.01)

(56) References Cited

U.S. PATENT DOCUMENTS

| | | | |
|---|---|---|---|
| 2009/0017387 A1 | 1/2009 | Shoki | |
| 2010/0155728 A1 | 6/2010 | Cha | |
| 2015/0294917 A1* | 10/2015 | deVilliers | H01L 21/2658 |
| | | | 438/7 |
| 2018/0090307 A1* | 3/2018 | Brunner | H01L 21/02016 |

OTHER PUBLICATIONS

"Overcoming challenges in 3D NAND volume manufacturing", Author: Harmeet Singh, (https://electroiq.com/2017/07/overcoming-challenges-in-3d-nand-volume-manufacturing/), 5 pages.

* cited by examiner

TECHNIQUES AND APPARATUS FOR ANISOTROPIC STRESS COMPENSATION IN SUBSTRATES USING ION IMPLANTATION

This application claims the benefit of priority to PCT International Patent Application No PCT/CN2018/109604, filed Oct. 10, 2018, entitled "Techniques and Apparatus for Anisotropic Stress Compensation in Substrates Using Ion Implantation," which application is incorporated herein by reference in its

FIELD

The present embodiments relate to stress control in substrates, and more particularly to stress compensation to reduce anisotropic planar stress in substrates.

BACKGROUND

Devices such as integrated circuits, memory devices, and logic devices may be fabricated on a substrate such as a silicon wafer by a combination of deposition processes, etching, ion implantation, annealing, and other processes. Often, a stress may be generated within layers or patterned devices formed on a surface of a substrate. Formation of some structures may entail the deposition of multiple layers, leading to the buildup of stress on a substrate. This layer stress may be manifest as a biaxial (planar stress) oriented along a main surface of the substrate. In some cases, the planar stress may be substantially parallel to the first main surface of the substrate, and may be isotropic in nature, wherein the stress values oriented along different directions within a plane parallel to the first main surface are the same. As such, the isotropic biaxial stress may contribute to the well-known phenomenon of substrate bowing. As an example, a compressive layer stress results in a convex bowing of the substrate, while tensile layer stress causes concave bowing of the substrate.

In substrates having patterned features, such as vertical NAND (VNAND) memory devices, device formation may entail deposition of dozens of alternating layers, also leading to the buildup of biaxial stress, or planar stress. In some examples, slits may be formed within a stack of layers, wherein the slits are aligned along a common direction. The slits may cause a stress relief along the common direction, leading to an anisotropic planar stress, where the stress along a first direction within the plane of the substrate may have a greater value than the stress along a second direction within the plane of the substrate, perpendicular to the first direction. This anisotropic planar stress may cause the substrate to exhibit a different amount of bowing along the first direction, as opposed to the amount of bowing along the second direction.

It is with respect to these and other considerations the present embodiments are provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a method is provided. The method may include an operation of providing a substrate, where the substrate includes a first main surface and a second main surface, opposite the first main surface. The second main surface may include a stress compensation layer. The method may include a further operation of directing ions to the stress compensation layer in an ion implant procedure. As such, the ion implant procedure may include exposing a first region of the stress compensation layer to a first implant process, wherein a second region of the stress compensation layer is not exposed to the first implant process.

In a further embodiment, a method may include providing a patterned substrate, where the patterned substrate includes a first main surface and a second main surface, opposite the first main surface. According to some embodiments, the patterned substrate further includes an assembly of features, disposed on the first main surface, the where the assembly of features generates a first stress state over the patterned substrate. The first stress state may include an anisotropic stress within the first main surface. The method may further include depositing a stress compensation layer on the second main surface, and exposing the stress compensation to an ion implant procedure. The implant procedure may include scanning a first ion beam with respect to the patterned substrate to implant a first dose of ions in a first region of the stress compensation layer. As such, a second region of the stress compensation layer is not exposed to the first dose of ions.

In another embodiment, an apparatus for substrate stress control is provided. The apparatus may include a beam scanner to scan an ion beam with respect to a substrate, where the substrate includes a stress control layer. The apparatus may include a user interface, coupled to the beam scanner, as well as a controller, coupled to the beam scanner and the user interface. The controller may include a processor, and a memory unit coupled to the processor, where the memory unit includes a scan routine. The scan routine may be operative on the processor to receive substrate stress information from the user interface, and to generate an implant pattern to control the beam scanner, where the implant pattern is to generate an anisotropic stress within the stress control layer.

DETAILED DESCRIPTION

Figure 1A:
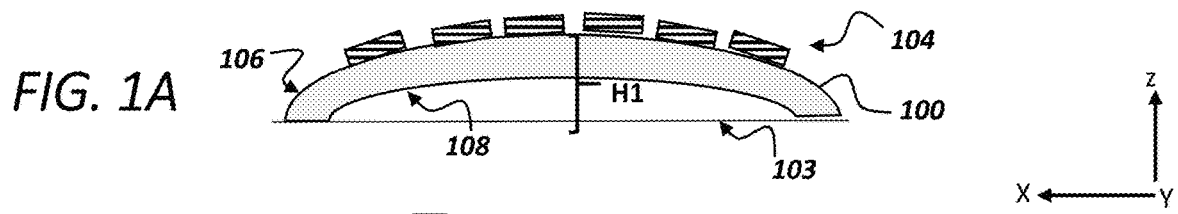
FIGS. 1A-1F depicts a side cross-sectional view of a substrate at various stages of a stress compensation operation, according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein relate to techniques and apparatus for improved stress control in a substrate, such as a semiconductor wafer having patterned structures formed therein. The present embodiments may be employed during device fabrication to reduce stress developing during wafer processing, such as device fabrication. Various embodiments may be employed to reduce planar stress and in particular to reduce anisotropic planar stress.

The present embodiments may employ an ion beam generated in an ion implanter, in particular, scanned spot beams. Various embodiments employ novel ion implantation approaches to alter substrate curvature induced by stress in features formed on the substrate during device processing. The present embodiments may employ novel patterns of implantation into a stress compensation layer provided to generate a compensating stress, where the compensating stress may operate to reduce curvature in the substrate. Some embodiments may generate an anisotropic planar stress to compensate for a pre-existing anisotropic planar stress generated by structures on the surface of a substrate.

Referring now to FIG. 1A there is shown a side cross-sectional view of a substrate 100 at a first instance during processing of the substrate 100. In this stage, an assembly of features has been formed on a first main surface 106 of the substrate 100, shown as features 104. The features 104 may represent a plurality of layers, devices, semiconductor die (chips), fabricated within surface regions of the substrate 100, as known in the art. While shown as discrete components, the features 104 may also be formed generally in continuous fashion across the surface of the first main surface 106. Said differently, the features 104 may be isolated from one another, connected to one another through continuous layers, partially connected to one another, isolated from one another along a first direction, while not isolated from one another along a second direction. During fabrication of the features 104, one layer or a plurality of layers (not separately) may be deposited on the substrate 100, where at least one layer may exhibit an intrinsic stress. As more layers are deposited, for example, the intrinsic stress within the layers may tend to increase, resulting in a curvature of the substrate 100 as shown.

The example shown in FIG. 1A represents a first stress state, where compressive stress has developed in the features 104, resulting in the convex curvature of the substrate 100 to compensate for the compressive stress. This curvature may be characterized by a first bowing, shown as H1. The value of H1 may generally represent the height of the center of the substrate 100 minus the height of the outside edges of the substrate 100. Said differently, the first bowing, H1, may represent the value of a perpendicular segment to a plane 103, where the plane 103 intersects opposite ends to the substrate 100 as shown, and the perpendicular extends through the center of the substrate. The value of H1 accordingly represents a maximum difference between the position of features on the first main surface 106 along the Z-axis of the cartesian coordinate system shown. Thus, features at the center of substrate 100 are positioned in an X-Y plane whose level is at a height represented by H1, with respect to features at the edge of the substrate. As such, various processing complications for processing of the substrate 100 may ensue, including the inability to properly image features during lithographic patterning.

In FIG. 1A the stress state may represent planar isotropic stress, where the resulting substrate bowing along the X-axis (shown in FIG. 1A) is the same as the substrate bowing along the Y-axis (not shown). In some embodiments, discussed further below, the stress state of FIG. 1A may represent planar anisotropic stress, where the resulting substrate bowing is different along the X-axis as opposed to along the Y-axis.

Figure 1B:
Figure 1C:
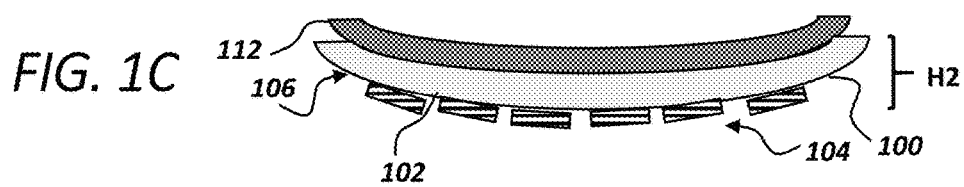

In accordance with embodiments of the disclosure, these types of substrate bowing may be addressed by a combination of deposition and ion implantation. Turning to FIG. 1B, there is shown a subsequent instance where depositing species 110 are directed to the second main surface 108 of the substrate 100, opposite the first main surface. In various embodiments, the depositing species 110 may be such to form a suitable layer, such as silicon nitride or other material. The embodiments are not limited in this context. The resulting layer is shown as a stress compensation layer 112, in FIG. 1C.

According to various embodiments the stress compensation layer 112 may be deposited to an appropriate thickness, in order to generate an adequate compensating stress to adjust the substrate bowing such as shown in FIG. 1A. As is known, the curvature induced by a deposited layer on a substrate, having a given substrate thickness, is proportional to the product of the stress in the deposited layer times the thickness in the deposited layer. Thus, for a given stress to be imparted into the stress compensation layer 112, the thickness of the stress compensation layer 112 may be adjusted to generate a targeted stress-thickness product to produce a targeted change in the substrate bowing. According to various embodiments, the stress compensation layer may have a thickness of 100 nm to 500 nm. The embodiments are not limited in this context. In accordance with different embodiments, the stress compensation layer 112, as-deposited, may have a neutral stress (zero stress), tensile stress, or compressive stress. As such, the stress compensation layer 112, by any internal stress within the stress compensation layer 112, may or may not alter the bowing of the substrate 100, to exhibit a value, shown as H2.

Figure 1D:
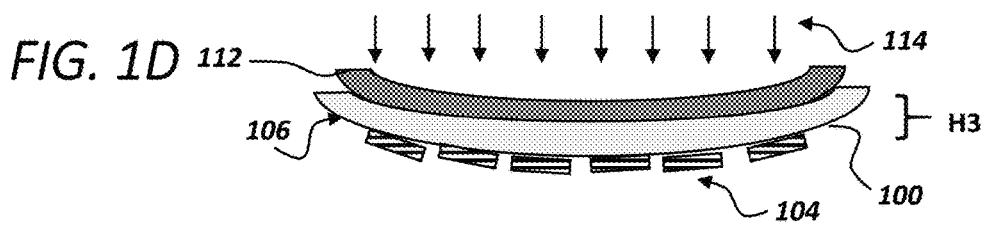
Figure 1E:
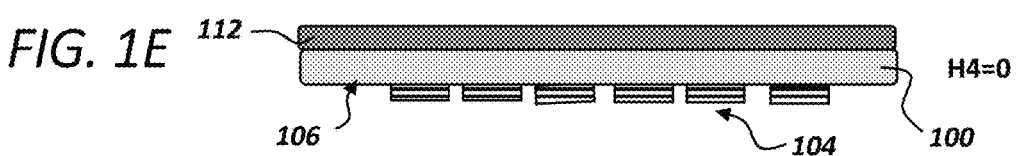
Figure 1F:
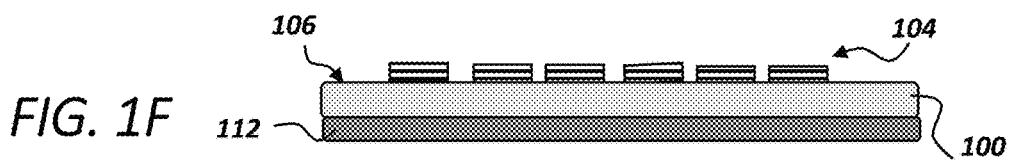

Turning to FIG. 1D and FIG. 1E there are shown subsequent instances where an ion implantation procedure (ion implant procedure) is performed, to direct ions 114 into the stress compensation layer 112. In the example shown in FIG. 1D and FIG. 1E, the ions 114 may be directed to the stress compensation layer 112 in a blanket exposure, while in other embodiments, detailed below, the ion implant procedure may expose a first region of the stress compensation layer 112 to a first implant process, while a second region of the stress compensation layer 112 is not exposed to the first implant process.

In accordance with various embodiments, as the implanting of the ions 114 proceeds the stress state within the stress compensation layer 112 may alter, resulting in a countering stress developing in the stress compensation layer 112, where the countering stress tends to reduce the substrate bowing as shown, to a value of H3, and then a value of H4, which latter value is shown as zero, merely for the purposes of illustration. In other embodiments, the substrate bowing may exhibit a finite value, or may exhibit a finite value in the reverse direction as compared to the bowing in FIG. 1A.

According to various embodiments the ion energy of ions 114 may be tuned to implant ions within an appropriate depth of the stress compensation layer 112, in order to induce an adequate change in stress state. In some examples, the ions 114 may be directed into the stress compensation layer 112 at an energy of 100 keV to 1 MeV. The embodiments are not limited in this context.

Figure 2:
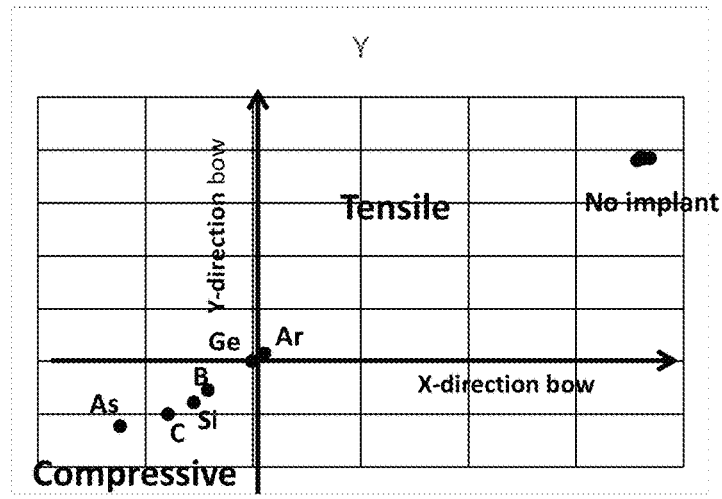
FIG. 2 depicts experimental results of stress compensation, consistent with the present embodiments.

FIG. 2 depicts experimental results of stress compensation, consistent with the present embodiments, where ion implantation into a stress compensation layer has been performed using various implant species. The stress compensation layer in this example is a silicon nitride layer deposited on a substrate by low pressure chemical vapor deposition. No patterned structures or other layers are present on the substrate.

The implantation performed is a blanket implantation into a substrate having an initial (original) substrate bowing along the X-direction and along the Y-direction, indicative of planar isotropic tensile stress. For each implant species blanket implantation was performed at an appropriate energy and ion dose to reduce the substrate bowing towards zero or to be slightly negative, indicative of compressive stress. In each case, the reduction of planar stress is isotropic, meaning the value of substrate bowing and changes in substrate bowing along the X-direction and Y-direction are the same. Thus, in accordance with different embodiments of the disclosure, the planar stress in a stress compensation layer, and the resulting substrate bowing, may be tuned in a consistent manner using a variety of implant species.

Figure 3:
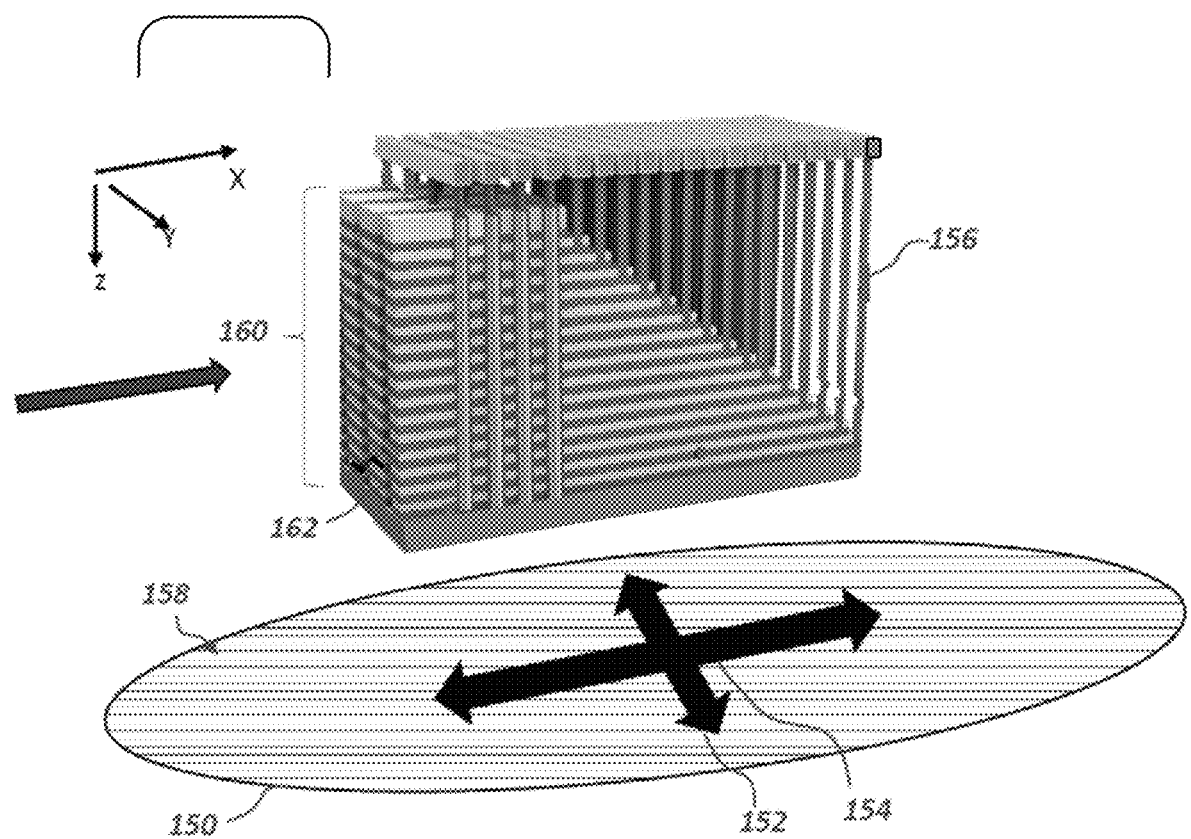
FIG. 3 depicts one scenario for formation of anisotropic stress on a substrate.

Turning now to FIG. 3, there is shown for formation of anisotropic planar stress in a substrate 150. The substrate 150 may represent a semiconductor wafer, for example, the substrate 150 may be processed in a manner where semiconductor die including multiple devices are fabricated on or near one main surface of the substrate. For purposes of illustration, a VNAND device 156 is shown, where the VNAND device 156 may be fabricated in semiconductor chips extending over the first main surface 158 of the substrate 150. The VNAND device 156 may be formed using a layer stack 160, as in known devices. The layer stack 160 may include dozens of individual layers, resulting in a significant layer stress after formation. This layer stress may be imparted into the substrate 150, resulting in substrate bowing, discussed previously. Notably, at the stage of processing shown in FIG. 3 vertical slits 162 have been formed in the layer stack 160, where the vertical slits may be oriented along a specific direction, shown as parallel to the X-axis of the Cartesian coordinate system. As such, due to the presence of the vertical slits 162, stress may be relieved, at least partially along the Y-direction, as opposed to along the X-direction, where the layer stack 160 may extend in a continuous fashion. As such, the stress vector 152, indicative of the stress along the Y-direction, is shown as smaller than the stress vector 154, indicative of stress along the X-direction. This stress anisotropy may generate an anisotropic bowing in the substrate 150.

In accordance with embodiments of the disclosure, techniques and apparatus are provided to address anisotropic bowing in a substrate. In particular, a stress compensation layer may be formed on a second main surface of a substrate where an ion implant procedure is performed to induce an anisotropic biaxial stress in the stress compensation layer, compensating for a first anisotropic curvature in the substrate before the ion implant procedure. For instance, the first anisotropic curvature may be characterized by a first difference between a first substrate bowing along a first direction (X-axis) and a second substrate bowing along a second direction (Y-axis), perpendicular to the first direction. As a specific example, referring also to FIG. 3, the substrate bowing along the Y-axis caused by the formation of VNAND devices 156, may be 5 µm, while the substrate bowing along the X-axis is 50 µm, yielding an anisotropic curvature of 50 µm −5 µm, or 45 µm. As such, the provision of an isotropic implantation procedure may reduce change the planar stress along the X-axis and along the X-axis in a similar manner, where an overall anisotropy in stress and substrate bowing still persists.

According to various embodiments, the anisotropic curvature in a substrate may be reduced by performing special ion implantation procedures into a stress compensation layer, to induce a compensating anisotropic stress. Said differently, after an ion implant procedure, a substrate will exhibit a second anisotropic curvature less than the first anisotropic curvature, before the ion implant procedure. This reduction means the substrate bowing is changed where a second difference (after implantation) between a third substrate bowing along the first direction (X-axis) and a fourth substrate bowing along the second direction (Y-axis), is less than the first difference in substrate bowing (before implantation) along the X-axis vs substrate bowing along the Y-axis.

In view of the above considerations, according to various embodiments, the amount of stress anisotropy induced in a stress compensation layer, and thus the amount of anisotropic curvature induced by the stress compensation layer, may be tuned according to the value of the first anisotropic curvature, before ion implantation. Substrates exhibiting a relatively higher degree of anisotropic curvature may be subjected to an implant procedure inducing a relatively higher degree of compensating anisotropic curvature, induced by the stress compensation layer.

Figure 4A:
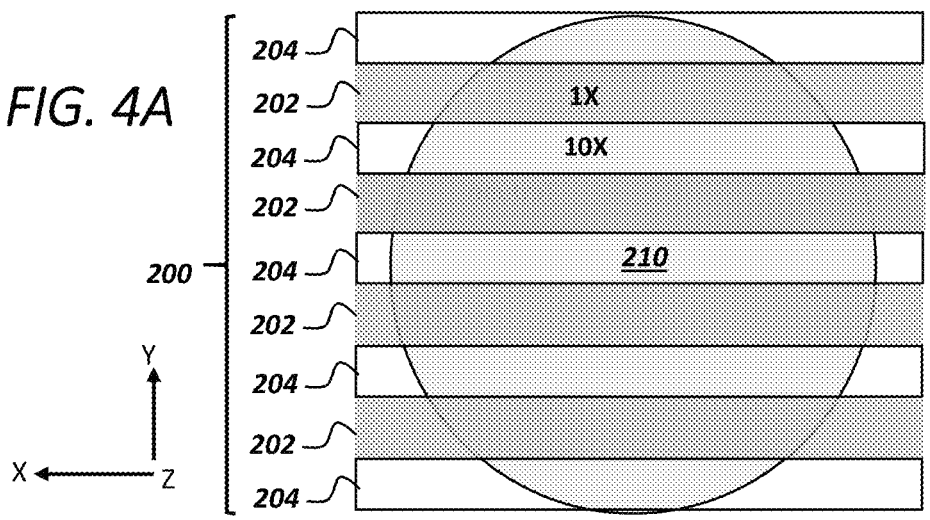
FIGS. 4A-4C depict the geometry for different stress compensation operations, consistent with various embodiments of the disclosure.
Figure 4B:
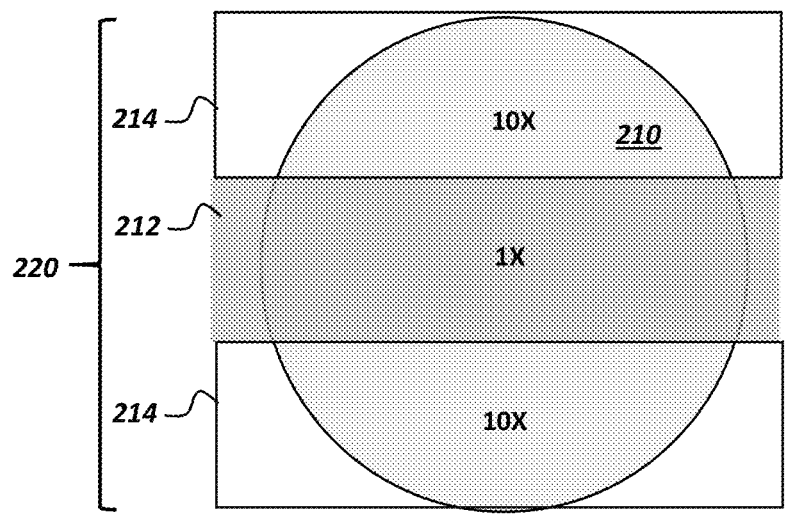
Figure 4C:
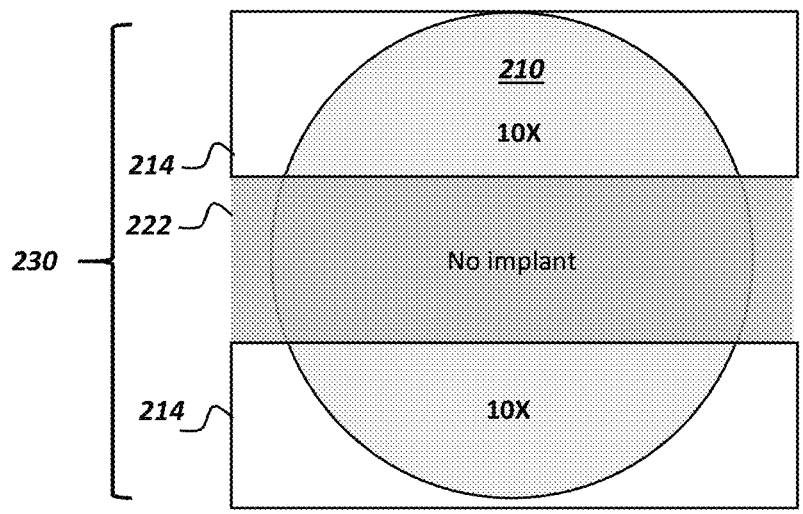

Turning to FIGS. 4A-4C there is shown the geometry in plan view for different stress compensation operations, consistent with various embodiments of the disclosure. As described below, generally the degree of anisotropic curvature was tuned by generating a pattern of implantation stripes where ion dose may vary from 0 to the E15/cm² range. The appropriate dose to change bowing may depend upon ion energy, thickness of stress compensation layer, ion species, and so forth. In FIG. 4A an implant pattern 200 is shown, reflecting the geometry of an ion implant procedure performed into a stress compensation layer (not separately shown) disposed on a second main surface of the substrate 210. The implant pattern 200 is composed of a plurality of implantation stripes, shown as implantation stripes 202 and implantation stripes 204, alternating with one another. The implantation stripes 202 are formed by implanting a dose of ions of As (1X), while the implantation stripes 204 are formed by implanting a 10λ dose of As ions. In this example, a total of implantation 9 stripes are generated across the second main surface of the substrate 210, where the substrate 210 is a 300 mm Si substrate. When the implant pattern 200 is applied to a substrate 210, without any patterned features, an anisotropic curvature is induced in the substrate of 4 µm, meaning the substrate bowing along the X-axis differs from the substrate bowing along the Y-axis by 4 µm. Thus, the implant pattern 200 may be appropriately applied where a substrate, such as a substrate having patterned features on a first main surface, exhibits a first anisotropic curvature in the range of 4 µm.

Notably, the implant pattern 200 may be applied to counter the first anisotropic curvature in a substrate by orienting the substrate so the implant procedure tends to reduce the difference between substrate bowing along the X-axis as opposed to substrate bowing along the Y-axis. For example, the wafer bowing tends to be greater along the direction of the implant stripes. Thus, the treatment of FIG. 4A generates a bowing along the X-direction 4 µm greater than the bowing along the Y direction. Accordingly, a substrate having a bowing greater along the X direction than the Y direction may be treated by aligning the implant stripes of FIG. 4A to generate a compensating anisotropic bowing to reduce the difference in bowing in the substrate.

Thus, if initial substrate bowing is 20 μm along the X-axis and 16 μm along the Y-axis, the substrate 210 may be oriented so the implant pattern 200 reduces bowing along the X-axis by 20 μm and reduces bowing along the Y-axis by 16 μm, resulting in an overall isotropic planar stress of zero both along the X-axis and along the Y-axis.

In FIG. 4B an implant pattern 220 is shown, reflecting the geometry of an ion implant procedure performed into a stress compensation layer (not separately shown) disposed on a second main surface of the substrate 210. The implant pattern 220 is composed of a plurality of implantation stripes, shown as a central implantation stripe 212 and two implantation stripes, implantation stripes 214, alternating with one another. The central implantation stripe 212 is formed by implanting a dose of 1× As, while the implantation stripes 214 are formed by implanting a dose of 10× As ions. In this example, a total of implantation 3 stripes are generated across the second main surface of the substrate 210, where the substrate 210 is a 300 mm Si substrate. When the implantation pattern 220 is applied to a substrate 210, without any patterned features, an anisotropic curvature is induced in the substrate of 12 μm. Thus, the implant pattern 220 may be appropriately applied where a substrate, such as a substrate having patterned features on a first main surface, exhibits a first anisotropic curvature in the range of 12 μm.

Notably, the implant pattern 220 may be applied to counter the first anisotropic curvature in a substrate by orienting the substrate so the implant procedure tends to reduce the difference between substrate bowing along the X-axis as opposed to substrate bowing along the Y-axis. Thus, if initial substrate bowing is 20 μm along the X-axis and 8 μm along the Y-axis, the substrate 210 may be oriented so the implant pattern 220 reduces bowing along the X-axis by 20 μm and reduces bowing along the Y-axis by 8 μm, resulting in an overall isotropic planar stress of zero both along the X-axis and along the Y-axis.

In FIG. 4C an implant pattern 230 is shown, reflecting the geometry of an ion implant procedure performed into a stress compensation layer (not separately shown) disposed on a second main surface of the substrate 210. The implant pattern 230 is composed of a plurality of implantation stripes, where a central stripe 222 is unimplanted and is flanked by the implantation stripes 2, alternating with one another. The implantation stripes 214 are formed by implanting a 10λ dose (same as in FIG. 4B, 4A) of As ions. In this example, a total of implantation 3 stripes are generated across the second main surface of the substrate 210, where the substrate 210 is a 300 mm Si substrate. When the implantation pattern 230 is applied to a substrate 210, without any patterned features, an anisotropic curvature is induced in the substrate of 32 μm. Thus, the implant pattern 230 may be appropriately applied where a substrate, such as a substrate having patterned features on a first main surface, exhibits a first anisotropic curvature in the range of 32 μm. Of course, in this example and other examples, the implant patterns may be applied to partially compensate for an initial anisotropic curvature, where the implant pattern reduces anisotropic curvature, while not eliminating the anisotropic curvature.

Notably, the implant pattern 230 may be applied to counter the first anisotropic curvature in a substrate by orienting the substrate so the implant procedure tends to reduce the difference between substrate bowing along the X-axis as opposed to substrate bowing along the Y-axis. Thus, if initial substrate bowing is 40 μm along the X-axis and 8 μm along the Y-axis, the substrate 210 may be oriented so the implant pattern 230 reduces bowing along the X-axis by 40 μm and reduces bowing along the Y-axis by 8 μm, resulting in an overall isotropic planar stress of zero both along the X-axis and along the Y-axis.

Figure 5A:
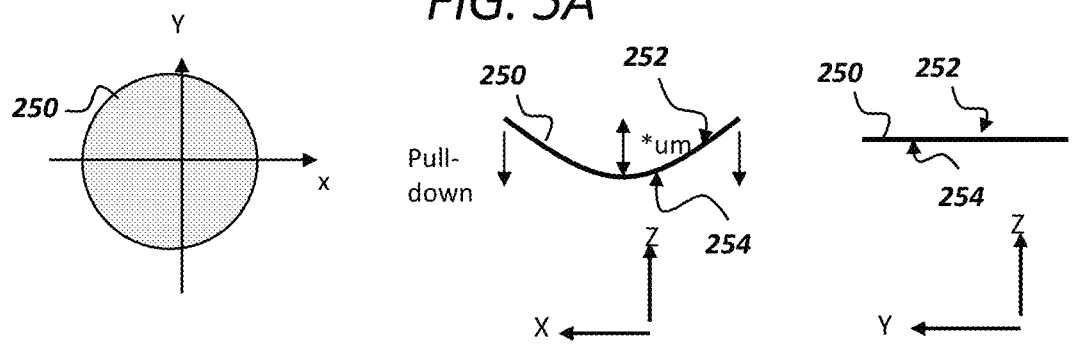
FIGS. 5A-5C depict the substrate geometry during various operations in a stress compensation procedure, consistent with various embodiments of the disclosure.
Figure 5B:
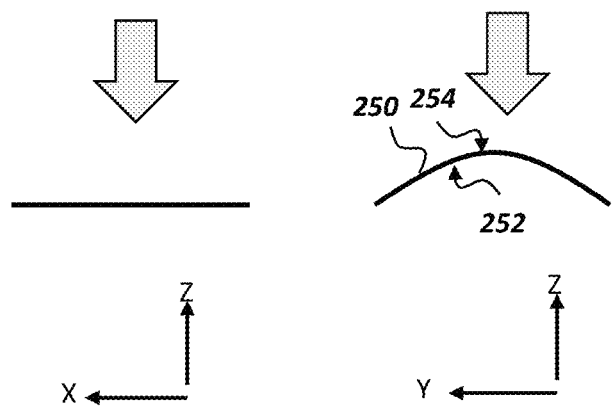
Figure 5C:
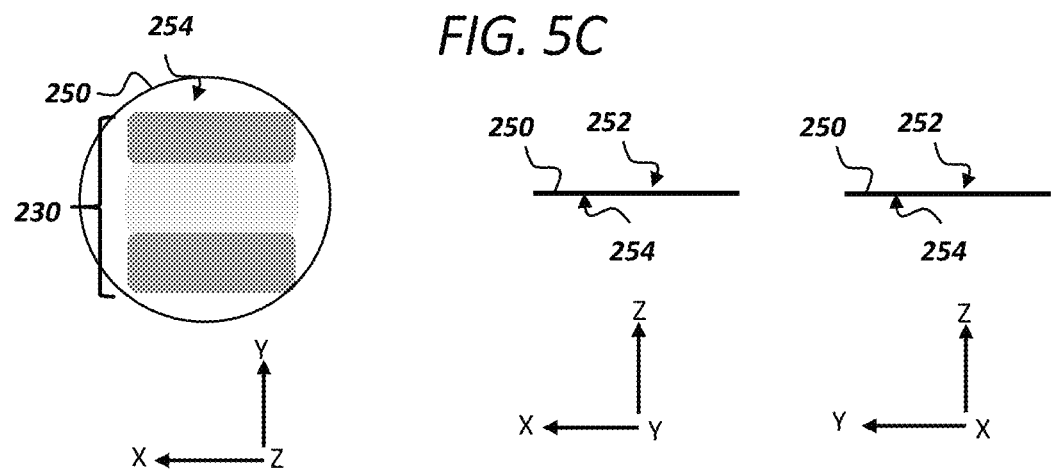

FIGS. 5A-5C depict the substrate geometry during various operations in a stress compensation procedure, consistent with various embodiments of the disclosure. The sequence illustrated shows the geometrical relation between an initial anisotropic curvature in a substrate, such as curvature generated by anisotropic stress in patterned structures on a first main surface of a substrate, and stress compensation procedures to reduce the anisotropic curvature. At FIG. 5A, a substrate 250 is shown where an anisotropic tensile stress has been generated on a first main surface 252, such as by VNAND device fabrication, or any other source of anisotropic curvature. The anisotropic curvature is manifested as a flat substrate along the Y-axis and a concave substrate curvature along the X-axis as shown, indicative of unidirectional tensile stress in a layer on the first main surface 252.

At FIG. 5B, there is shown a first operation where a stress compensation layer (not separately shown) is deposited on the second main surface 254. After deposition of the stress compensation layer the stress compensation layer may generate an isotropic stress on the second main surface 254. In some examples, a CVD layer as deposited as the stress compensation layer may exhibit a tensile stress. Because the tensile stress is deposited on the second main surface 254, the effect will be to generate the curvature as shown, where the substrate 250 along the X-axis will end to have less curvature than initially in FIG. 5A, because the compensating tensile stress of the stress compensation layer on second main surface 254 opposes the tensile stress on the first main surface 252. In FIG. 5A, the substrate 250 is shown as flat along the X-axis, while in some embodiments the stress after deposition of the stress compensation layer may still provide a curvature to substrate along the X-axis, albeit reduced from the curvature of FIG. 5A. In FIG. 5B, the compensating tensile stress formed on the second main surface 254 may render the substrate 250 curved, along the Y-axis, as shown.

Turning to FIG. 5C there is shown a plan view of the substrate 250, where the implant pattern 230 is applied in stripes, parallel to the X-axis as shown. Notably, the implantation of ions into the substrate 300 may tend to release or reduce tensile stress (see FIG. 2). Since the implant pattern 230 affects stress and substrate curvature in an anisotropic manner, the orientation of the implant pattern 230 with stripes along a given direction will have an anisotropic effect on the curvature or stress in the substrate. In this example, the tensile stress is reduced along the Y-axis, perpendicular to the directions of the implant stripes, resulting in a flatter profile of the substrate 250 along the Y-axis, while not affecting the profile along the X-axis. Notably, the processes outlined in FIGS. 5A-5C are schematic, and the amount of anisotropic curvature in a substrate to be compensated may vary, and may be addressed by different implant patterns, as discussed above.

Figure 6A:
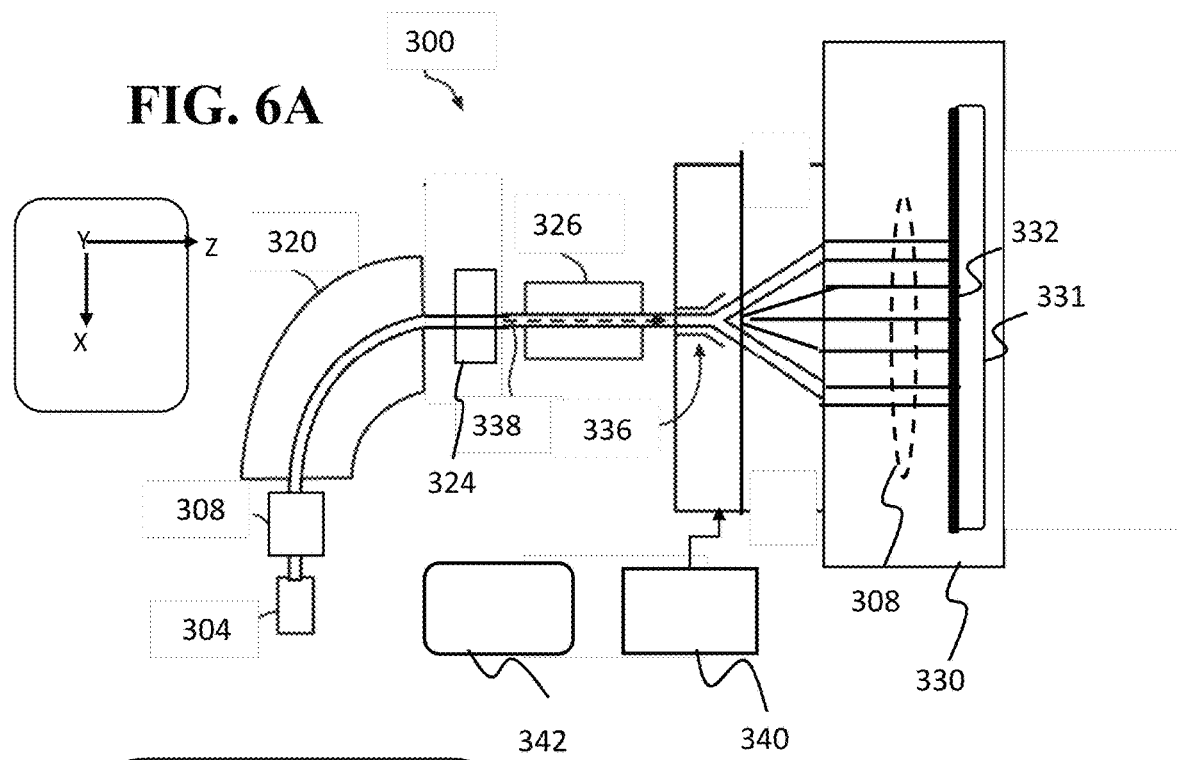
FIGS. 6A-6B depict different representations of an ion implanter, consistent with various embodiments of the disclosure.

FIG. 6A depicts a schematic top view of an ion implantation system for generating and anisotropic stress control in accordance with embodiments of the disclosure. m in accordance with embodiments of the present disclosure. The ion implantation system, referred to as ion implanter 300, represents a process chamber containing, among other components, an ion source 304 for producing an ion beam 308, and a series of beam-line components. The ion source 304 may comprise a chamber for receiving a flow of gas and generating ions. The ion source 304 may also comprise a power source and an extraction electrode assembly (not shown) disposed near the chamber. The beam-line components may include, for example, an analyzer magnet 320, a mass resolving slit (MRS) 324, a steering/focusing component 326, and end station 330, including substrate holder 131.

The ion implanter 300 further includes a beam scanner 336 positioned along a beamline 338 between the MRS 324 and the end station 330. The beam scanner 336 may be arranged to receive the ion beam 308 as a spot beam and to scan the ion beam 308 along a fast scan direction, such as parallel to the X-Axis in the Cartesian coordinate system shown. Notably, the substrate 332 may be scanned along the Y-axis, so a given ion treatment may be applied to a given region of the substrate 332 as the ion beam 308 is simultaneously scanned back and forth along the X-axis. The ion implanter 300 may have further components, such as a collimator as known in the art (not shown for clarity), to direct ions of the ion beam 308, after scanning, along a series of mutually parallel trajectories to the substrate 332, as suggested in FIG. 5A. In various embodiments, the ion beam may be scanned at a frequency of several Hz, 10 Hz, 100 Hz, up to several thousand Hz, or greater. For example, the beam scanner 336 may scan the ion beam 308 using magnetic or electrostatic scan elements, as known in the art.

By scanning the ion beam 308 rapidly over a fast scan direction, such as back and forth over along the X-axis, the ion beam 308, configured as a spot beam, may deliver a targeted ion dose of uniform density across a substrate 332. In accordance with various embodiments, the ion beam 308 may be controlled, responsive to user input, to generate a target implant pattern (see FIGS. 4A-4C) by a combination of scanning of the substrate 332 in conjunction with scanning of the ion beam 308.

For example, the ion implanter 300 may further include a controller 340, coupled to the beam scanner 336, to coordinate operation of the beam scanner 136 and substrate stage 331. As further shown in FIG. 5A, the ion implanter 300 may include a user interface 342, also coupled to the controller 340. The user interface 342 may be embodied as a display, and may include user selection devices, including touch screens, displayed menus, buttons, knobs, and other devices as known in the art. According to various embodiments, the user interface 342 may send instructions to the controller 340 to generate an appropriate implant pattern for the substrate 332, according to the user input.

Figure 6B:
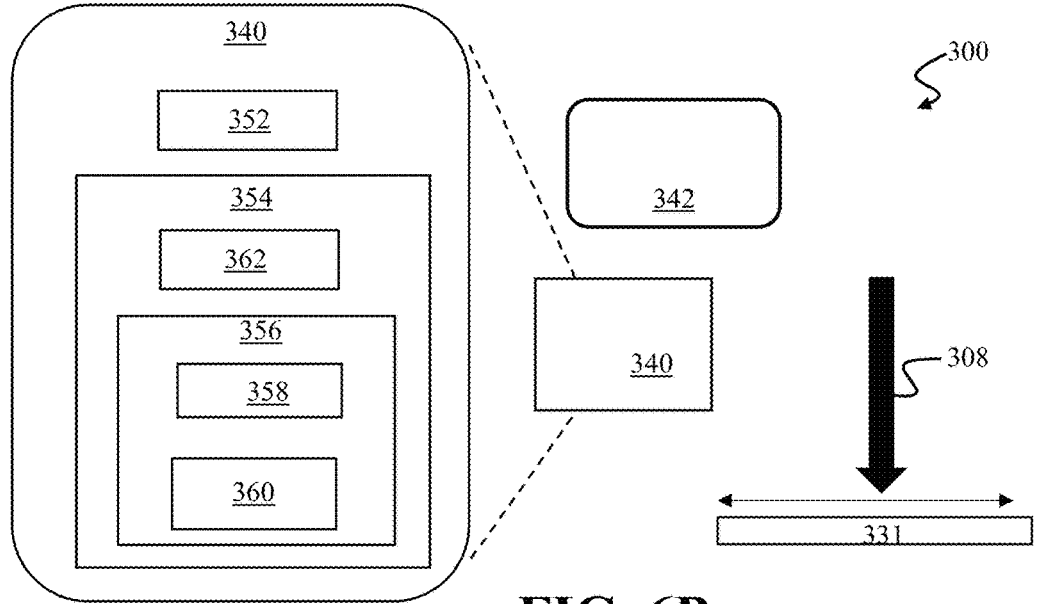

As further shown in FIG. 6B, the controller 340 may include a processor 352, such as a known type of microprocessor, dedicated processor chip, general purpose processor chip, or similar device. The controller 340 may further include a memory or memory unit 354, coupled to the processor 352, where the memory unit 354 contains a scan routine 356. The scan routine 356 may be operative on the processor 352 to manage scanning of the ion beam 308 and substrate 332 as described below. The memory unit 354 may comprise an article of manufacture. In one embodiment, the memory unit 354 may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

In particular embodiments, the scan routine 356 may include an implant pattern processor 358 and scan control processor 360. The implant pattern processor 358 may receive a set of substrate stress information, such as from user interface 342, indicative of the stress state in a substrate 332. The substrate stress information may include substrate thickness, stress compensation layer thickness, anisotropic curvature of the substrate, and so forth. The implant pattern processor 358 may use the substrate stress information to calculate an appropriate implant pattern information to counter the anisotropic curvature of the substrate. The implant pattern information may include ion dose, ion species, and size of implant stripes as generally discussed above. In various embodiments, a series of implant patterns may be stored in a database 362, where the different implant patterns may be correlated to different levels of anisotropic curvature in a substrate. The scan control processor 360 may control scanning of the substrate 332, as well as scanning of the ion beam 308 to implement the implant pattern in the substrate 332. Thus, in various embodiments, the treatment of the substrate using an implant pattern to generate anisotropic stress in a stress control layer may be automated, or partially automated.

Figure 7:
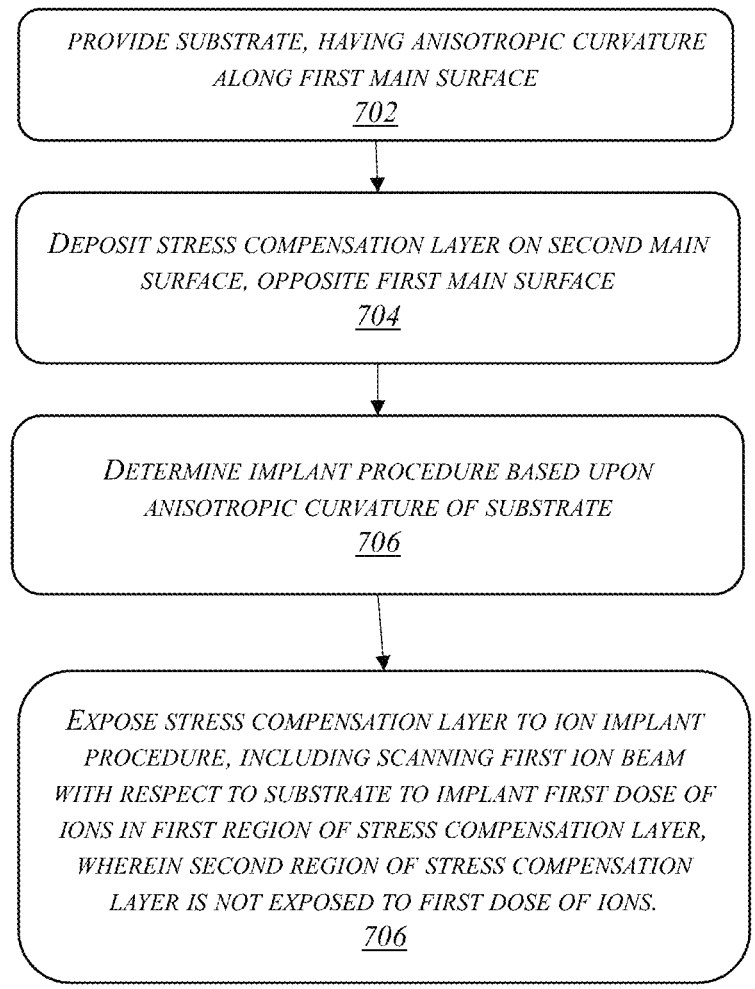
FIG. 7 depicts an exemplary process flow.

Turning now to FIG. 7, there is shown a process flow 700, according to some embodiments of the disclosure.

At block 702, the operation is performed of providing a substrate. Generally, the substrate may have an anisotropic stress within the first main surface or within features disposed on the first main surface, resulting in an anisotropic curvature of the substrate. In particular embodiments, the substrate may be a patterned substrate, where the patterned includes any number of layers, devices, or structures on the first main surface. The patterned substrate may be characterized by a second main surface, opposite the first main surface.

At block 704, a stress compensation layer is deposited on the second main surface. In some non-limiting embodiments, the stress compensation layer may have a thickness between 100 nm and 500 nm.

At block 706, an implant procedure is determined based upon the anisotropic curvature of the substrate. The implant procedure may include an implant pattern, including ion energy, ion species, ion dose, and so forth. The implant procedure may be calculated to compensate for the anisotropic curvature of the substrate.

At block 708 the stress compensation layer is exposed to the ion implant procedure, where the implant procedure includes scanning a first ion beam with respect to the substrate to implant a first dose of ions in a first region of the stress compensation layer, wherein a second region of the stress compensation layer is not exposed to the first dose of ions. In some embodiments the first region may be composed of at least one stripe, and the second region may similarly be composed of one or more stripes, where the total number of stripes is at least 3. In some embodiments the second region may be unimplanted, while in other embodiments, the second region may be exposed to a second dose of ions, different from the first dose of ions, may be exposed to a different implant species, different implant energy, or combination of the above.

Advantages provided by the present embodiments are multifold. As a first advantage, the present embodiments afford the ability to dynamically adjust substrate curvature during processing. In other words, based upon unwanted substrate curvature induced at a stage of device fabrication, such as during formation of VNAND devices, the unwanted substrate curvature may be reduced by a straightforward combination of deposition of a stress compensation layer followed by ion implantation. This intervention allows subsequent device to proceed with more accuracy, such as subsequent lithography steps requiring relatively flat substrates. As a second advantage, the present embodiments facilitate reduction or elimination of anisotropic stress using novel patterned implantation procedures, allowing anisotropic substrate curvature to be reduced or eliminated.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   providing a substrate, the substrate comprising a first main surface and a second main surface, opposite the first main surface, the second main surface including just a stress compensation layer;
   receiving a set of substrate stress information, indicative of a stress state in the substrate, the substrate stress information including an anisotropic curvature of the substrate;
   retrieving an implant pattern according to a level of the anisotropic curvature of the substrate; and
   implementing the implant pattern in the substrate by:
      directing ions to the stress compensation layer in an ion implant procedure, the ion implant procedure comprising:
      exposing a first region of the stress compensation layer to a first implant process,
      wherein a second region of the stress compensation layer is not exposed to the first implant process, wherein the first region and the second region form a target implant pattern, wherein the target implant pattern is generated by a combination of scanning of the substrate along a first scan direction in conjunction with scanning of the ions as an ion beam along a second scan direction, perpendicular to the first scan direction.

2. The method of claim 1, wherein the substrate is a patterned substrate, the patterned substrate further comprising an assembly of features, disposed on the first main surface, the assembly of features generating a first stress state over the patterned substrate, the first stress state comprising an anisotropic stress along the first main surface.

3. The method of claim 1, wherein the stress compensation layer comprises an anisotropic biaxial stress in the second main surface after the ion implant procedure.

4. The method of claim 1, wherein the substrate exhibits a first anisotropic curvature along the first main surface before the ion implant procedure, the first anisotropic curvature comprising a first difference between a first substrate bowing along a first direction and a second substrate bowing along a second direction, perpendicular to the first direction, and
   wherein the substrate exhibits a second anisotropic curvature after the ion implant procedure, the second anisotropic curvature comprising a second difference between a third substrate bowing along the first direction and a fourth substrate bowing along the second direction, the second anisotropic curvature being less than the first anisotropic curvature.

5. The method of claim 4, wherein the first substrate bowing is greater than the second substrate bowing, and wherein the first region comprises a plurality of implant stripes, oriented along the second direction.

6. The method of claim 4, wherein the implant pattern comprising a central stripe, oriented along the second direction, the central stripe being unimplanted, and wherein the central stripe is flanked by a first implant stripe on a first side and a second implant stripe on a second side.

7. The method of claim 1, comprising exposing the second region of the stress compensation layer to a second implant process, different from first implant process.

8. The method of claim 1, wherein the stress compensation layer comprises a thickness of 100 nm to 500 nm.

9. The method of claim 1, wherein the first implant process comprises directing the ions to the stress compensation layer at an energy of 100 keV to 1 MeV.

10. A method, comprising;
    providing a patterned substrate, the patterned substrate comprising a first main surface and a second main surface, opposite the first main surface, the patterned substrate further comprising:
       an assembly of features, disposed on the first main surface, the assembly of features generating a first stress state over the patterned substrate, the first stress state comprising an anisotropic stress within the first main surface;
    depositing a stress compensation layer on the second main surface;
    receiving a set of substrate stress information, indicative of a stress state in the patterned substrate, the substrate stress information including an anisotropic curvature of the patterned substrate;
    retrieving an implant pattern according to a level of the anisotropic curvature of the patterned substrate; and
    implementing the implant pattern in the patterned substrate by:
    exposing the stress compensation layer to an ion implant procedure, wherein the ion implant procedure comprises:
    scanning the patterned substrate along a first scan direction in conjunction with scanning of an ion beam along a second scan direction, perpendicular to the first scan direction,
    to implant a first dose of ions in a first region of the stress compensation layer in a first implant process,
    wherein a second region of the stress compensation layer is not exposed to the first dose of ions.

11. The method of claim 10, wherein the patterned substrate exhibits a first anisotropic curvature along the first main surface before the ion implant procedure, the first anisotropic curvature comprising a first difference between a first substrate bowing along a first direction and a second substrate bowing along a second direction, perpendicular to the first direction, and wherein the patterned substrate exhibits a second anisotropic curvature after the ion implant procedure, the second anisotropic curvature comprising a second difference between a third substrate bowing along the first direction and a fourth substrate bowing along the second direction, the second anisotropic curvature being less than the first anisotropic curvature.

12. The method of claim 11, wherein the implant pattern comprises a central stripe, oriented along the second direction, the central stripe being unimplanted, and wherein the central stripe is flanked by a first implant stripe on a first side and a second implant stripe on a second side.

13. The method of claim 10, comprising exposing the second region of the stress compensation layer to a second implant process, different from first implant process.

14. The method of claim 10, wherein the stress compensation layer comprises a thickness of 100 nm to 500 nm, and wherein the first implant process comprises directing the ions to the stress compensation layer at an energy of 100 keV to 1 MeV.

* * * * *